(12) United States Patent
Takahashi et al.

(10) Patent No.: US 9,177,641 B2
(45) Date of Patent: Nov. 3, 2015

(54) MEMORY DEVICE

(71) Applicants: Masahiro Takahashi, Seongnam-si (KR); Tsuneo Inaba, Seongnam-si (KR); Dong Keun Kim, Icheon-si (KR); Ji Wang Lee, Icheon-si (KR)

(72) Inventors: Masahiro Takahashi, Seongnam-si (KR); Tsuneo Inaba, Seongnam-si (KR); Dong Keun Kim, Icheon-si (KR); Ji Wang Lee, Icheon-si (KR)

(*) Notice: Subject to any disclaimer, the term of this patent is extended or adjusted under 35 U.S.C. 154(b) by 0 days.

(21) Appl. No.: 14/018,306

(22) Filed: Sep. 4, 2013

(65) Prior Publication Data

US 2014/0286082 A1    Sep. 25, 2014

Related U.S. Application Data

(60) Provisional application No. 61/804,562, filed on Mar. 22, 2013.

(51) Int. Cl.
*G11C 13/00* (2006.01)
*G11C 11/16* (2006.01)

(52) U.S. Cl.
CPC .......... *G11C 13/004* (2013.01); *G11C 11/1673* (2013.01); *G11C 2013/0054* (2013.01); *G11C 2213/79* (2013.01)

(58) Field of Classification Search
CPC . G11C 13/0004; G11C 13/0069; G11C 11/16
USPC ................ 365/185.03, 185.05, 158, 148, 163
See application file for complete search history.

(56) References Cited

U.S. PATENT DOCUMENTS

| | | | |
|---|---|---|---|
| 6,778,432 B2* | 8/2004 | Ohtani | 365/171 |
| 6,898,104 B2* | 5/2005 | Ogiwara et al. | 365/145 |
| 6,937,523 B2* | 8/2005 | Eshel | 365/185.28 |
| 7,414,908 B2* | 8/2008 | Miyatake et al. | 365/210.1 |
| 7,633,809 B2* | 12/2009 | Kajiyama | 365/185.25 |
| 2002/0051381 A1 | 5/2002 | Numata et al. | |
| 2003/0230733 A1 | 12/2003 | Tanaka | |
| 2003/0231525 A1 | 12/2003 | Mine | |
| 2007/0280021 A1 | 12/2007 | Ueda et al. | |
| 2009/0010045 A1 | 1/2009 | Uedai | |

FOREIGN PATENT DOCUMENTS

| | | |
|---|---|---|
| JP | 2002-100181 A | 4/2002 |
| JP | 2004-020325 A | 1/2004 |
| JP | 2004-022073 A | 1/2004 |
| JP | 2007-323706 A | 12/2007 |
| JP | 2009-015949 A | 1/2009 |

* cited by examiner

*Primary Examiner* — Huan Hoang
*Assistant Examiner* — Minh Dinh
(74) *Attorney, Agent, or Firm* — Holtz, Holtz, Goodman & Chick PC

(57) ABSTRACT

According to one embodiment, a memory device includes a memory cell, a sense amplifier, and a resistor. The sense amplifier includes a first input and a second input, outputs a signal in accordance with a difference between the first and second inputs, and is selectively coupled at a second input to the memory cell. The resistor is in a first path between the first input of the sense amplifier and a ground node.

11 Claims, 7 Drawing Sheets

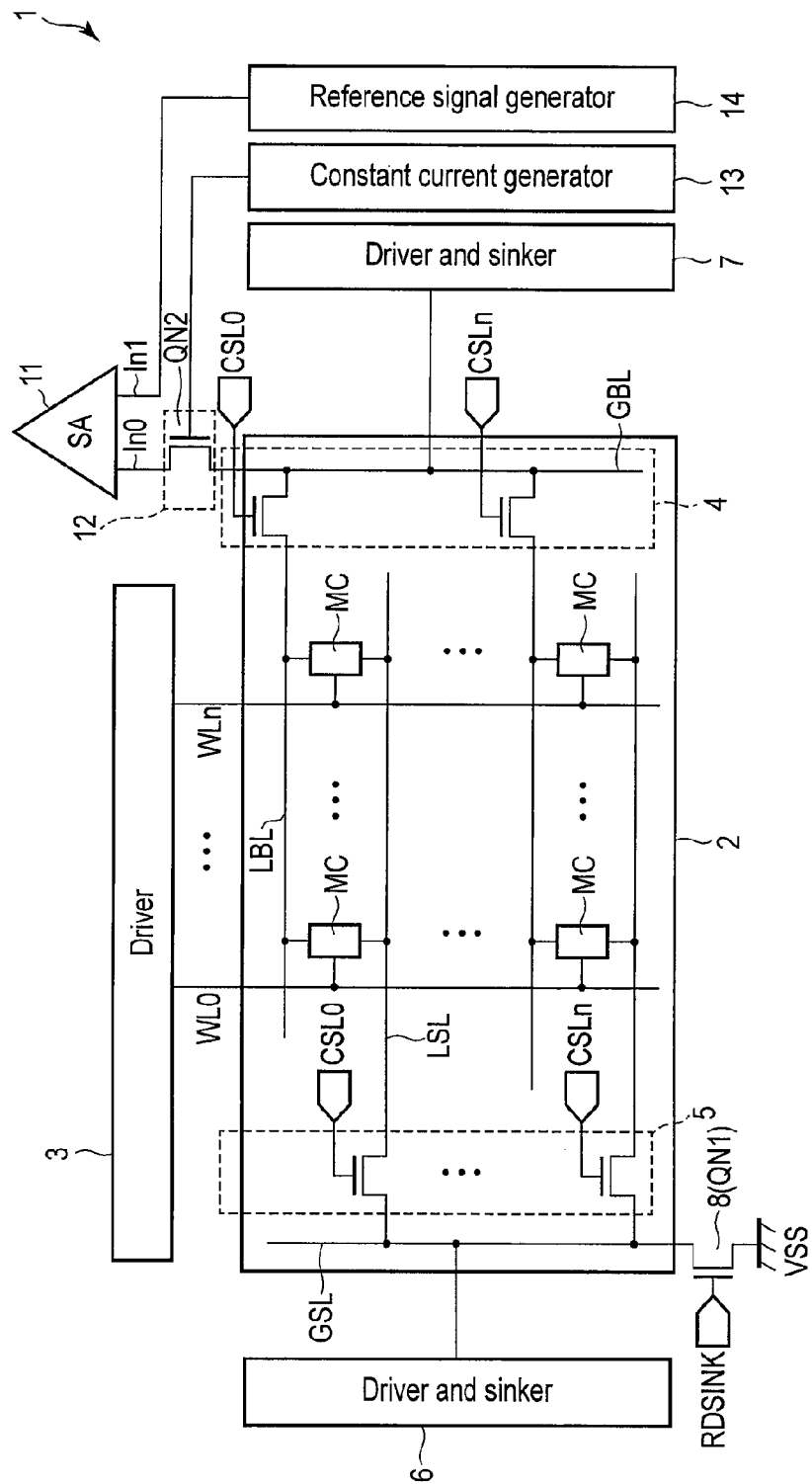
F I G. 3

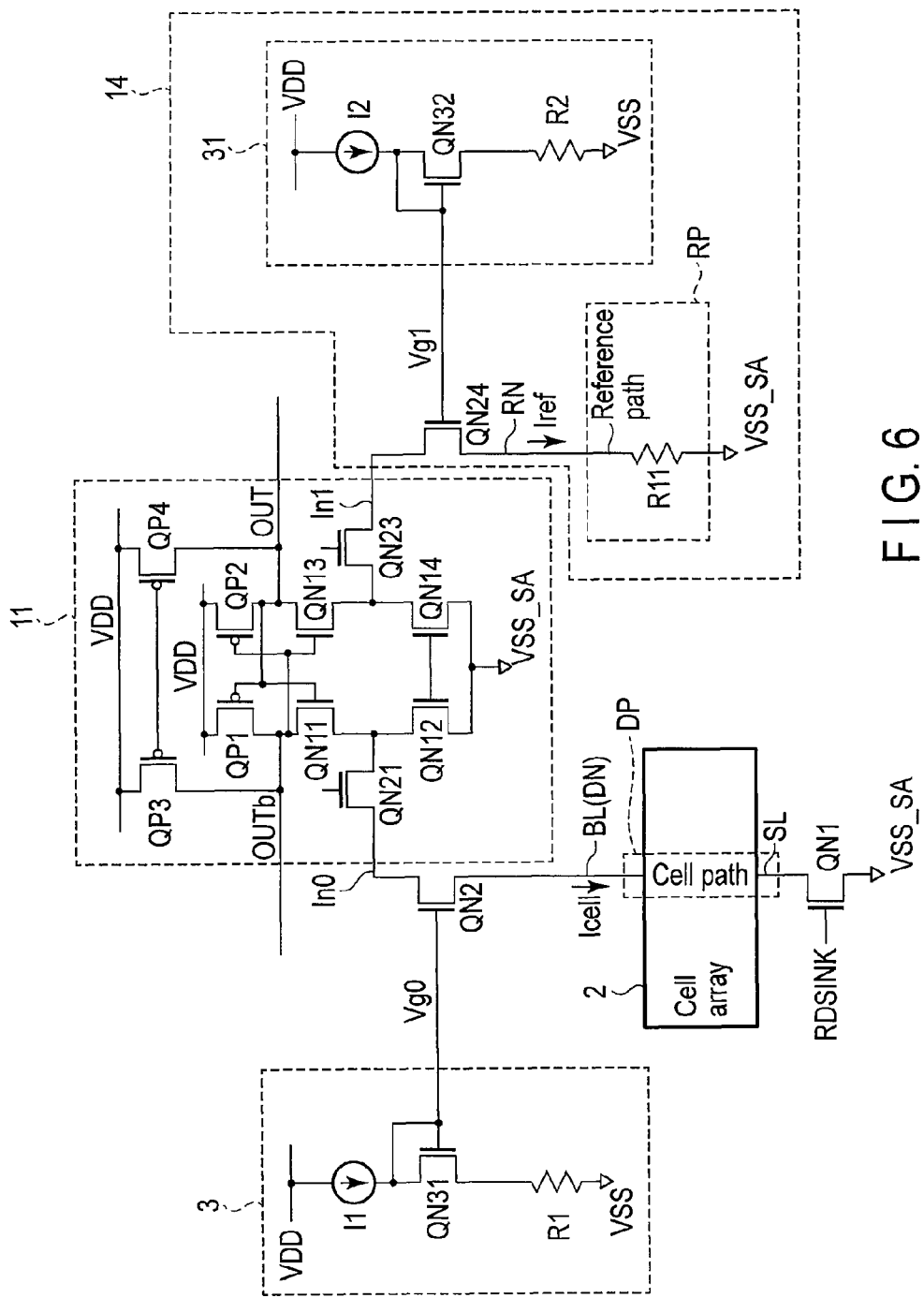
F I G. 6

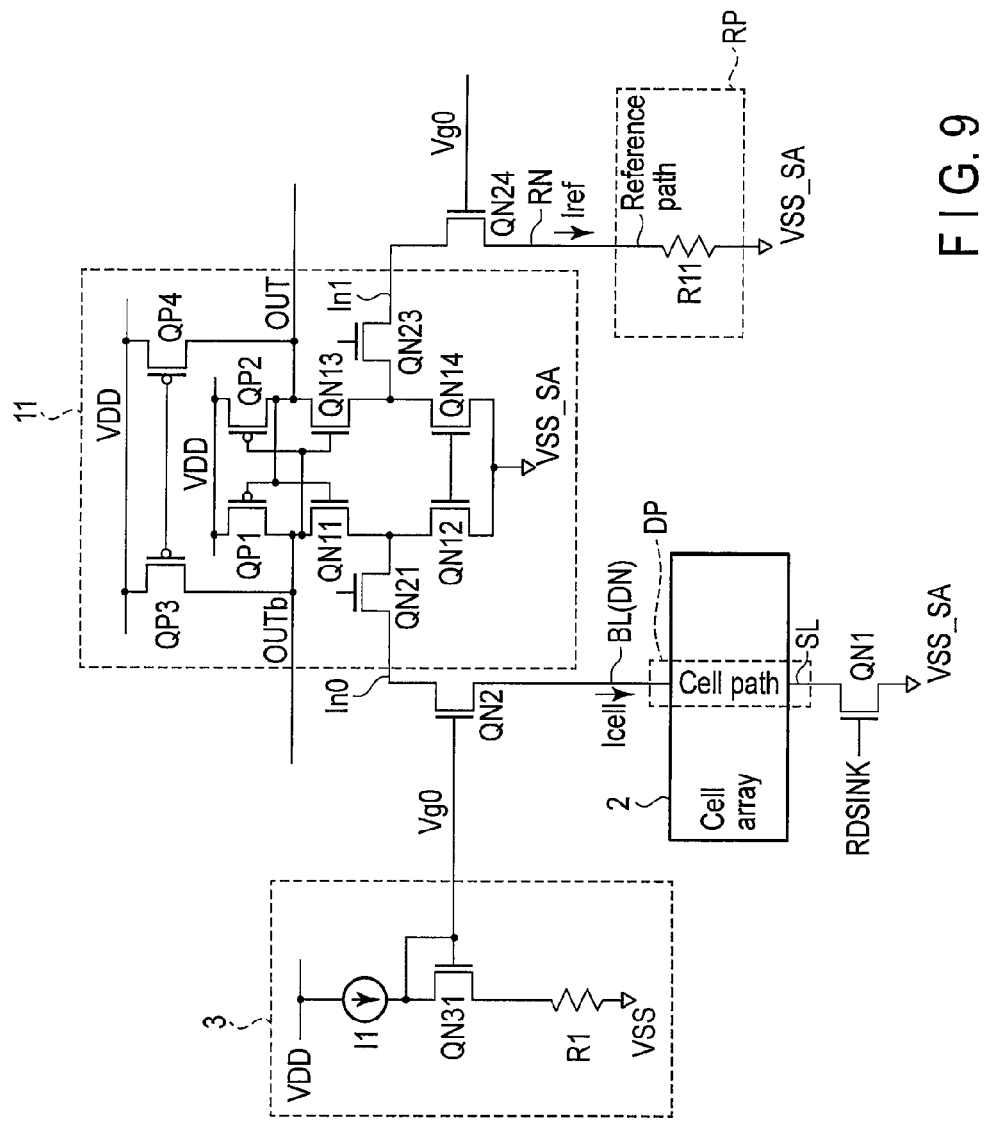
F I G. 9

MEMORY DEVICE

CROSS-REFERENCE TO RELATED APPLICATIONS

This application claims the benefit of U.S. Provisional Application No. 61/804,562, filed Mar. 22, 2013, the entire contents of which are incorporated herein by reference.

FIELD

Embodiments described herein relate generally to a memory device.

BACKGROUND

There are memory devices which use an element which takes a variable resistance as a memory cell.

BRIEF DESCRIPTION OF THE DRAWINGS

FIG. 3 is a block diagram of a memory device according to a first embodiment.
FIG. 6 is a circuit diagram of a part of the memory device according to the first embodiment.
FIG. 9 is a circuit diagram of a part of the memory device according to a second embodiment.

DETAILED DESCRIPTION

In general, according to one embodiment, a memory device includes a memory cell, a sense amplifier, and a resistor. The sense amplifier includes a first input and a second input, outputs a signal in accordance with a difference between the first and second inputs, and is selectively coupled at a second input to the memory cell. The resistor is in a first path between the first input of the sense amplifier and a ground node.

There are memory devices which use an element which takes a variable resistance as a cell. Such memory devices include a magnetoresistive random access memory (MRAM). MRAMs use magnetic tunnel junction (MTJ) elements for their cells. An MTJ element takes different resistance states in accordance with the direction of a current which flows through it. Two different resistance states are associated with states of storing 0 and 1 data, respectively, which allows for storing of information.

Figure 1:
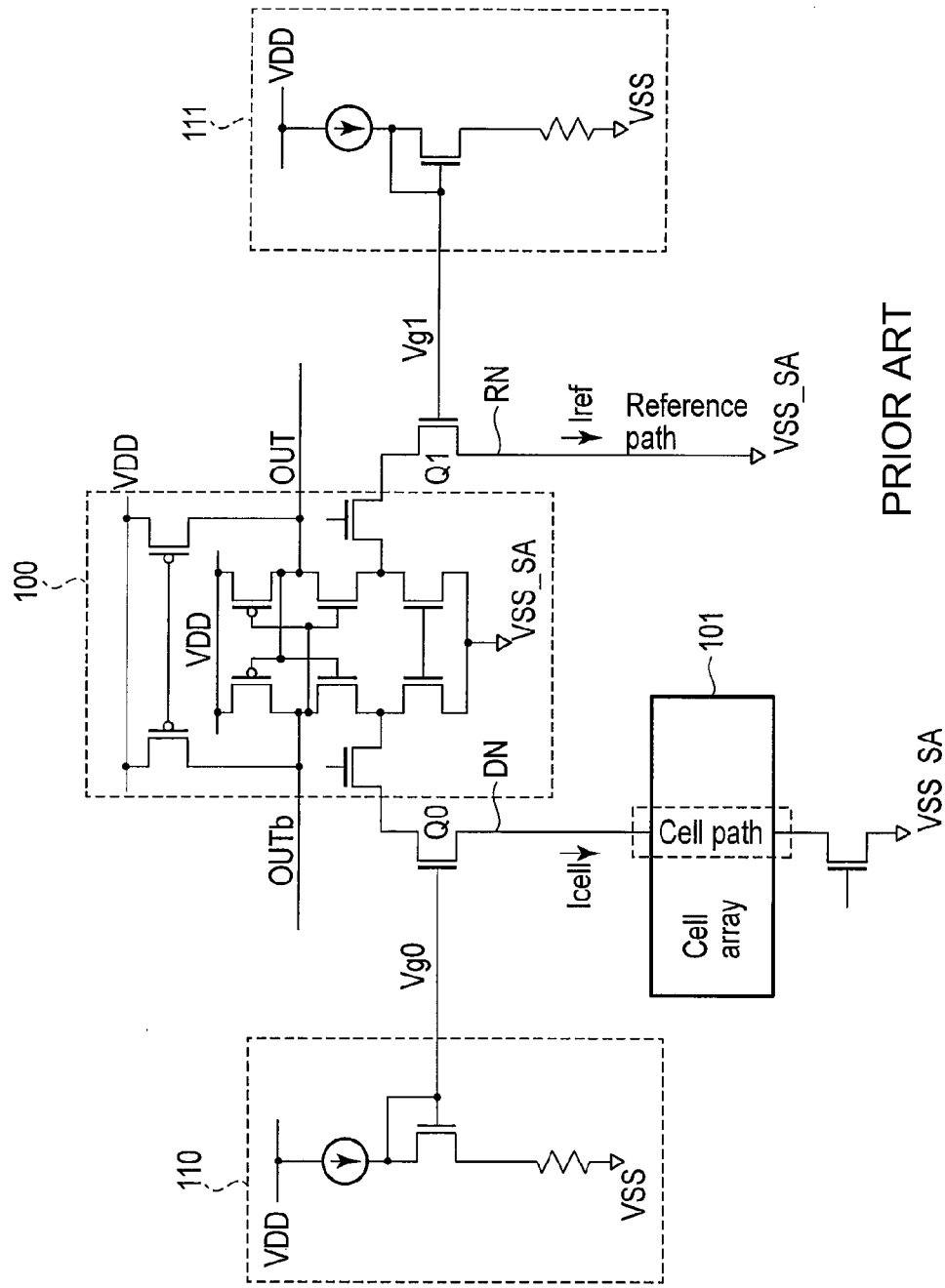
FIG. 1 illustrates an example of a current detection type sense amplifier.

Data stored in the cells is read with, for example, a current detection type sense amplifier. FIG. 1 illustrates an example of the current detection type sense amplifier 100 disclosed by, for example, the U.S. Pat. No. 7,649,792 specification. Two inputs of the sense amplifier 100 are coupled to respective drains of transistors Q0 and Q1. Respective gates of transistors Q0 and Q1 receive potentials Vg0 and Vg1, respectively. Each of potentials Vg0 and Vg1 is an intermediate potential between the power supply potential node (or power supply node) VDD and the ground (or common) potential node (or ground node) VSS. The potentials Vg0 and Vg1 are generated by the voltage generators 110 and 111 such as shown in FIG. 1.

The source of transistor Q0 is a data cell node DN, is coupled to a node of potential VSS_SA via a cell array 101, and is coupled to a to-be-read cell during reads. In contrast, the source of the transistor Q1 is a reference node RN, and has the same potential as the node VSS_SA. During a read, a cell current Icell according to data held by the cell flows through the data cell node DN, and a reference current Iref flows through the reference node RN. The sense amplifier 100 determines the data stored in the to-be-read cell in accordance with whether the cell current Icell exceeds the reference current Iref.

The potentials VSS and VSS_SA are intended to be the same. Because of, however, reasons such as restriction of arrangement, the sense amplifier 100 may be positioned away from the voltage generators 110 and 111, which may result in different robustness of the potentials VSS and VSS_SA. Specifically, much current including that through the cell array 101 flows into the potential VSS_SA, whereas no such much current flows into the potential VSS because it is positioned away from the cell array 101. For this reason, the potential VSS_SA easily fluctuates unlike the potential VSS. This fluctuation behaves as a noise component to the potential VSS_SA. This noise in turn may cause the following phenomenon.

Assume that, as an example, the potential VSS_SA increases by 100 mV from zero. This also affects the data cell node DN and reference node RN. Cells (or MTJ elements) and parasitic resistance, however, are coupled to a data cell path between the data cell node DN and node VSS_SA. Therefore, a potential divided by various resistances including these resistances appears on the data cell node DN. This suppresses fluctuation of the potential of the source of the transistor Q0 to be small, and therefore the cell current Icell does not vary so much. In contrast, the reference node RN is directly coupled to the potential VSS_SA, and therefore a reference path between them only has a small resistance such as interconnect resistance. This results in significant fluctuation of the potential of the source of the transistor Q1, and therefore the reference current Iref varies greatly. In other words, the rise of the potential VSS_SA due to, for example, noise decreases the reference current Iref much more significantly than the cell current Icell. This greatly degrades the read margin as can be seen from FIG. 2.

Figure 2:
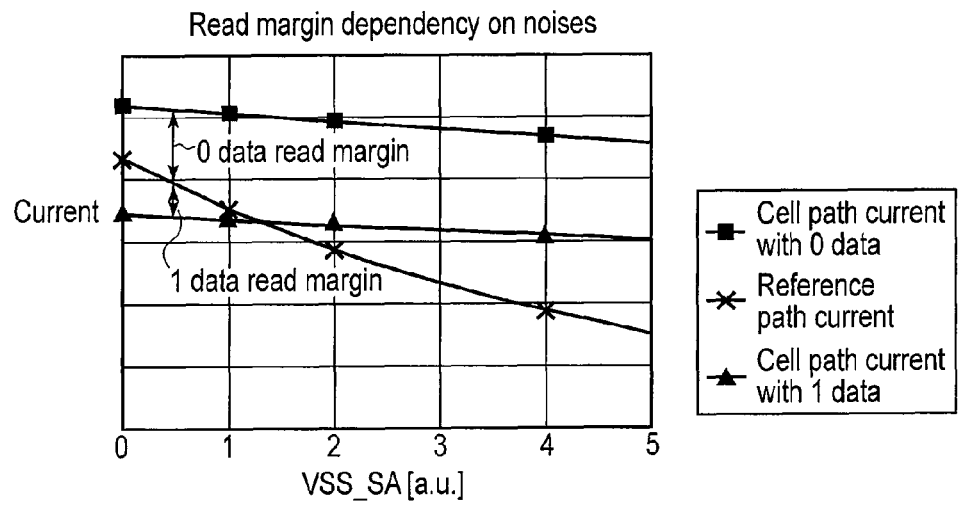
FIG. 2 illustrates a relationship between a potential VSS_SA and some currents.

FIG. 2 illustrates a current through a data cell path including a cell holding 0 data, a current through a data cell path including a cell holding 1 data, and a current through the reference path. FIG. 2 illustrates the various quantities of the noise added to the potential VSS_SA along the horizontal axis. The value 0 on the horizontal axis indicates no noise, and values further to the right along the horizontal axis indicates higher noises. As shown in FIG. 2, increased noises do not reduce data cell path currents so much. In contrast, they greatly decrease the reference path currents. This reduces the read margin for one of two types of data (1 data, in this example), and may disable a data read itself in a large-noise case.

Embodiments will now be described with reference to figures. Components with substantially the same functionalities and configurations will be referred to with the same reference number and duplicate descriptions will be made only when required. For descriptions for an embodiment omitted because of duplication, corresponding descriptions for another embodiment is applied. The embodiments only illustrate devices and methods which embody the technical idea thereof, and the technical idea do not limit the material, dimension, structure, and arrangement of components to the following ones. The technical idea of the embodiments may be variously changed in accordance with the scope of the claims.

First Embodiment

FIG. 3 illustrates a block diagram of a memory device according to a first embodiment. As shown in FIG. 3, a memory device 1 includes a memory cell array 2, a driver 3, column selectors 4 and 5, driver/sinker sets 6 and 7, a sinker 8, a sense amplifier 11, a clamp circuit 12, a constant current generator 13, a reference signal generator 14, etc.

Each functional block does not necessarily need to be distinguished this way. For example, some of functionalities may be implemented by functional blocks different from those illustrated below. Furthermore, an illustrated functional block may be divided into functional sub-blocks. The embodiments are not limited by the specification of the particular functional blocks.

The memory cell array 2 includes cells MC, a global bit line GBL, a global source line GSL, local bit lines LBL, local source lines LSL, word lines WL, and column selectors 4 and 5, etc. Each memory cell MC is coupled between a local bit line LBL and a local source line LSL, and coupled to a word line WL. Each memory cells MC includes at least a variable resistance element. The variable resistance element can take multiple resistance states with different magnitudes. As a variable resistance element, an MTJ element used for MRAMs, an element used for resistive random access memories (ReRAMs), or an element used for PRAMs or phase change random access memories (PCRAMs) is used, for example. Any mechanism of resistance change is possible, and does not limit the present embodiment. The memory cell array 2 will be described in full detail later.

The driver 3 selects a particular word line WL in accordance with address signals from outside the memory device 1. The column selectors 4 and 5 select a particular column in accordance with column select signals CSL0 to CSLn. The column select signals CSL0 to CSLn are supplied, for example, from outside the memory device 1, and one of the column select signals CSL0 to the CSLn is asserted. Selection of a word line WL and a column selects one cell MC.

The driver/sinker sets 6 and 7 supply a write current to a selected memory cell MC in conjunction. When the cell MC is the MTJ element, one of the driver/sinker sets 6 and 7 serves as a driver, and the other as a sinker, for example. Specifically, one of them supplies a write current and the other draws the write current so that the write current flows through a selected memory cell MC in the direction in accordance with data to be written into the selected memory cell MC. The sinker 8 includes, for example, an n-type metal oxide semiconductor field-effect transistor (MOSFET) QN1, receives a signal RDSINK from a controller (not shown) or outside the memory device 1, and is turned on during reads to couple the source line GSL to a potential VSS_SA node (or a node or ground node VSS_SA).

The sense amplifier 11 is provided for the memory cell array 2, and when the memory device 1 includes multiple memory cell arrays 2, a sense amplifier 11 is provided for each memory cell array 2. The sense amplifier 11 has two inputs In0 and In1, and amplifies the difference of the two inputs In0 and In1. The clamp circuit 12 includes an n-type MOSFET QN2, and clamps the source potential of the transistor QN2 to a desired potential. The constant current generator 13 supplies the gate of the transistor QN2 with a potential to clamp the source potential of the transistor QN2 to the desired potential. The reference signal generator 14 supplies a reference current to the input In1. The reference current is used as a reference to determine data during reads.

Figure 4:
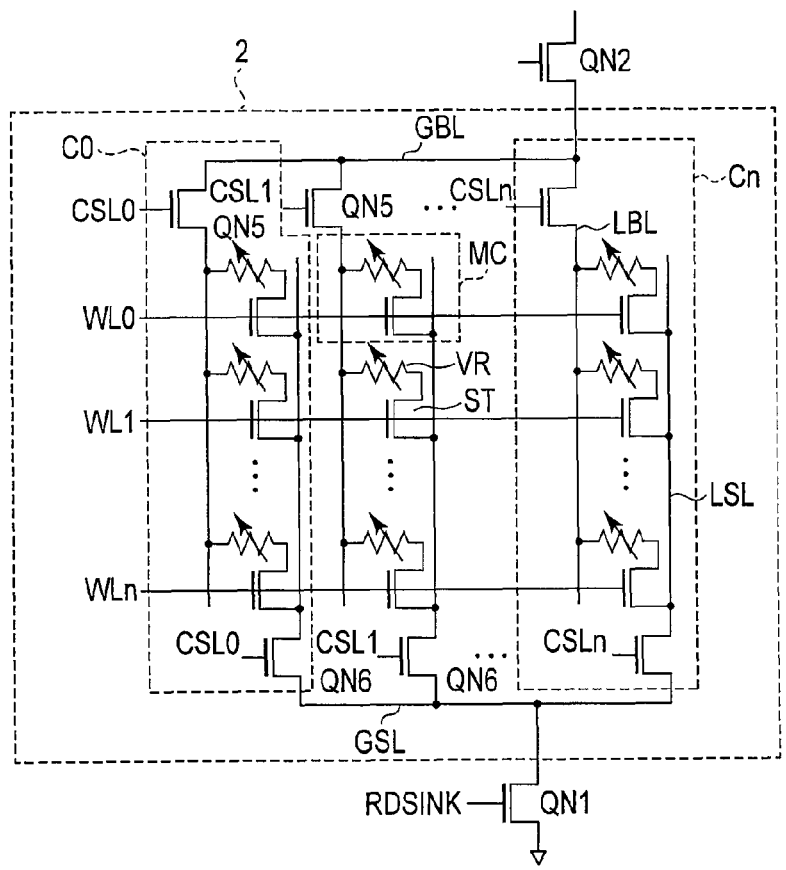
FIG. 4 illustrates a memory cell array according to a first embodiment.

The memory cell array 2 includes the multiple columns C0 to Cn, as shown in FIG. 4. FIG. 4 illustrates an example of the memory cell array of the first embodiment. When reference numbers with suffixes (for example, the column C) do not need to be distinguished from each other, the reference number without a suffix is used to refer to all corresponding reference numbers with suffixes. Each column C is coupled between the (global) bit line GBL and (global) source line GSL. The source line GSL is coupled to the node VSS_SA via the sinker QN1.

Each column C includes two column select transistors QN5 and QN6 (or column selectors 4 and 5). Each of the transistors QN5 and QN6 comprises an n-type MOSFET. The transistor QN5 is coupled between the bit line GBL and a corresponding local bit line LBL. Specifically, the columns C0 to Cn are respectively provided with local bit lines LBL0 to LBLn, and a transistor QN5 is coupled to the local bit line LBL of the corresponding column C. The transistor QN6 is coupled between the source line GSL and a corresponding local source line LSL. Specifically, the columns C0 to Cn are respectively provided with local source lines LSL0 to LSLn, and a transistor QN6 is coupled to the local source line LSL of the corresponding column C.

Respective transistors QN5 of the columns C0 to Cn receive column select signals CSL0 to CSLn at their gates, respectively. Similarly, respective transistors QN6 of the columns C0 to Cn receive the column select signals CSL0 to CSLn at their gates, respectively.

In each column C, multiple memory cells MC are coupled between the local bit line LBL and local source line LSL. The memory cells MC are arranged in a matrix. Each memory cell MC includes a variable resistance element VR. The variable resistance element VR can take multiple steady resistance-states with different magnitudes. Any element can be used as the variable resistance element VR, and MTJ elements, elements used for the ReRAMs, or elements used for the PRAMs or PCRAMs are used as described above. The element used for the PRAMs or PCRAMs takes a crystal state of a low resistance state or an amorphous state of a high resistance state after current appropriately controlled flows through the cell which comprises chalcogenide, for example. The element used for the ReRAMs takes a low resistance state or a high resistance state in accordance with the polarity of voltage applied.

Each memory cell MC further includes an element in accordance with the type of the variable resistance element VR. For example, with the present embodiment applied to a ReRAM, each memory cell MC includes at least a diode and the variable resistance element VR.

With the present embodiment applied to an MRAM, each memory cell MC further includes an n-type MOSFET ST. FIG. 4 illustrates such an example. The serial structure of the variable resistance element VR and transistor ST is coupled to the local bit line LBL at its variable resistance element side and to the local source line LSL at its transistor side. Each transistor ST of the $0^{th}$ row of the columns C0 to Cn is coupled to a word line WL0 at its gate. Similarly, sets of transistors ST of respective first row to $n^{th}$ rows are coupled to word lines WL1 to WLn, respectively.

Figure 5:
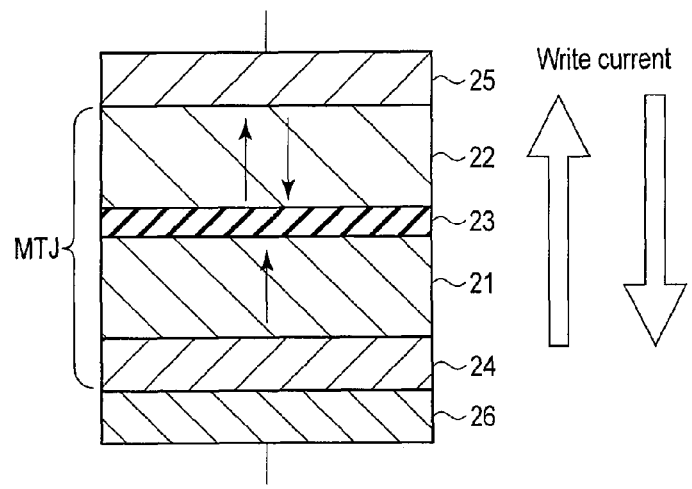
FIG. 5 illustrates an example of an MTJ element according to the first embodiment.

Each MTJ element is configured to take different steady resistance states in accordance with the direction of a current which flows through it. The phenomenon of exhibition of different resistances refers to as the magnetoresistive effect, which is used by the MTJ element to store data. FIG. 5 illustrates an example of such an MTJ element MTJ. As shown in FIG. 5, an MTJ element MTJ has a fixed layer 21, a storage layer 22, and an insulator 23 between them. The fixed layer 21 has its magnetization fixed by an antiferromagnetic layer 24. The storage layer 22 has a magnetization variable in accordance with the direction of a write current through it. The MTJ element MTJ exhibits a resistance state variable in accordance with relative relation between the direction of the magnetization of the fixed layer 21 and the direction of the magnetization of the storage layer 22. These different resistance states are associated with, for example, two values of one bit data, respectively. Layers 25 and 26 are electrodes, and have the MTJ element MTJ interposed between them.

FIG. 6 is a circuit diagram of a part of the memory device according to the first embodiment. As shown in FIG. 6, the sense amplifier 11 includes a p-type MOSFET QP1 and n-type MOSFETs QN11 and QN12 coupled in series between the power supply potential node (or power node) VDD and the node VSS_SA. The sense amplifier 11 further includes a p-type MOSFET QP2 and n-type MOSFETs QN13 and QN14 coupled in series between the node VDD and node VSS_SA.

The connection node of the transistors QP1 and QN11 outputs a signal OUTb. The "b" at the end of a name of element indicates the reversal logic of the element. The output node of the signal OUTb (or a node OUTb) is also coupled to the gates of the transistors QP2 and QN13. The connection node of the transistors QP2 and QN13 outputs a signal OUT. The output node of the signal OUT (or a node OUT) is coupled to the gates of the transistors QP1 and QN11. The gate of the transistor QN12 is coupled to the gate of the transistor QN14.

The nodes OUTb and OUT are coupled to the node VDD via p-type MOSFETs QP3 and QP4, respectively. The gate of the transistor QP3 is coupled to the gate of the transistor QP4.

The sense amplifier 11 further includes n-type MOSFETs QN21 and QN23. The transistor QN21 is coupled at its drain to the connection node of the transistors QN11 and QN12, and configures the input (or input node) In0 of the sense amplifier 11 at its source. As described above, transistor QN23 is coupled at its drain to the connection node of the transistors QN13 and QN14, and configures the input (or input node) In1 of the sense amplifier 11 at its source.

As described above, the input node In0 is coupled to the drain of the transistor QN2, and the source of the transistor QN2 is coupled to the bit line GBL. The gate of the transistor QN2 receives a potential Vg0. The potential Vg0 is supplied from the constant current generator 13 as described above. The constant current generator 13 includes the constant current source 11, an n-type MOSFET QN31, and the resistor R1 coupled in series between the node VDD and the (ground) node VSS. The gate of the transistor QN31 is coupled to its drain and the gate of the transistor QN2.

As described above, the input node In1 is coupled to the reference signal generator 14. The reference signal generator 14 includes an n-type MOSFET QN24 coupled between the input node In1 and node VSS_SA. The transistor QN24 clamps the voltage of the source of the transistor QN24 to a fixed value. The gate of the transistor QN24 receives a potential Vg1. The potential Vg1 is supplied from the constant current generator 31. The constant current generator 31 includes a constant current source 12, an n-type MOSFET QN32, and a resistor R2 coupled in series between the node VDD and node VSS. The gate of the transistor QN32 is coupled to its drain and the gate of the transistor QN24. The constant current generator 31 may be included in the constant current generator 13.

During data reads, the column select transistors QN5 and QN6 of a column to which a read-target cell MC belongs are turned on and the word line WL coupled to the read-target cell MC is made high to turn on the transistor ST of the target cell MC. This results in the read-target cell MC coupled between the source line GSL and bit line GBL. Moreover, the transistor QN1 is turned on. This results in a data-cell path DP including the selected cell MC formed between the bit line GBL (or a data-cell node DN) and node VSS_SA.

Thus, the data-cell course DP comprises the resistance of the bit line GBL, transistor QN5, on-resistance of the transistor QN6, local bit line LBL, variable resistance element VR, select-transistor ST, local source line LSL, and source line GSL.

Furthermore, sense amplifier 11 is enabled. This results in the cell current Icell flowing through the data-cell path DP, and the reference current Iref through a reference path RP between the source of the transistor QN24 (or a reference node RN) and node VSS_SA. The current Icell has a magnitude in accordance with the data stored by the read-target cell MC (or the direction of the magnetization of the storage layer 22 thereof). The sense amplifier 11 compares the current Icell and reference current Iref. In accordance with whether the current Icell is greater or less than the reference current Iref, the sense amplifier 11 outputs the corresponding signals OUT and OUTb.

Thus, the sense amplifier 11 detects the data of the cells MC through comparison with the cell current Icell and reference current Iref. Therefore, variation of the reference current Iref influences the read capability (or margin) of the sense amplifier 11. The node VSS_SA, however, may vary unlike the node VSS because of a current which flows into it from the memory cell array 2, or a current which flows when the circuit operates. The variation of the potential VSS_SA may fluctuate the reference current Iref more significantly than the cell current Icell. The reasons why the reference current Iref is influenced more greatly than the cell current Icell by the variation of the potential VSS_SA are the reference node RN made the same potential as, or coupled without an intervening component to, the node VSS_SA. This is contrastive to the data-cell node DN (or bit line GBL) coupled to the node VSS_SA via the memory cell array 2. Then, the memory device 1 includes a resistance (resistor) R11 between the reference node RN and node VSS_SA. The resistance R11 comprises one of a gate resistor, diffusion layer resistor, a metal resistor, and a transistor resistor, or a combination thereof, for example.

The resistance R11 has a value which prevents the variation of the potential VSS_SA from greatly fluctuating the reference current Iref. Typically, the value of the resistance R11 is selected to give the resistance of the data cell path DP a value similar to that of the reference path RP. The reference path RP and data cell path DP having similar resistances make the variation of the reference current Iref due to the variation of the potential VSS_SA closer or even similar to that of the cell current Icell. The data cell path DP, however, varies in accordance with the data stored in a read-target cell MC. Then, the resistance R11 has a value between that of the resistance of a data cell path DP including a particular memory cell MC holding 0 data, and that of a data cell path DP including that memory cell MC holding 1 data. Alternatively, the resistance R11 has a value of the average of the resistance of a data cell path DP including a particular memory cell MC holding 0 data and that of a data cell path DP including that memory cell MC holding 1 data. Furthermore, strictly, such an average about a particular memory cell MC may be determined for all memory cells MC, and the average of the determined averages may be calculated to be given to the resistance R11. More specifically, with the memory device 1 being an MRAM, and the resistance is greater than or equal to 10 kΩ, more particularly it is 10 kΩ in a particular generation. Such resistance has a large value as a resistor coupled to the reference node RN unlike a mere parasitic resistance coupled to it.

Figure 7:
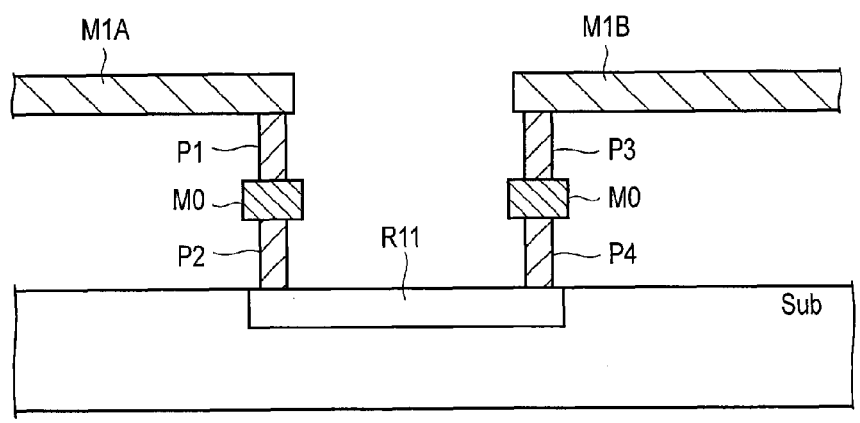
FIG. 7 is a sectional view of a part of the memory device according to the first embodiment.

Resistance R11 can be implemented, for example, by gate resistance, diffusion layer resistance, metal resistance, and transistor resistance. FIG. 7 illustrates a sectional view of the memory device according to the first embodiment in its part, especially the resistance R11 and associated components. The reference path RP generally comprises arrangement of interconnects and plugs as that of the data cell path DP. The bit line GBL and source line GSL of the data cell path DP comprise M1 interconnects above M0 interconnects above a substrate sub. In accordance with this, interconnects for the reference node RN and node VSS_SA comprise M1 interconnects. Then, in order to insert the resistance R11 between the reference node RN and the node VSS_SA, the resistance R11 is formed between an M1 interconnect M1A corresponding to the reference node RN and an M1 interconnect M1B corresponding to the node VSS_SA. The interconnects M1A and M1B are separate, and the interconnect M1A is coupled to a diffusion layer (i.e., resistance) R11 via a plug P1, an M0 interconnect M0, and a plug P2. The diffusion layer R11 is formed in the surface of the substrate sub. The diffusion layer R11 is also coupled to the interconnect M1B via a plug P4, an interconnect layer M0, and a plug P3. The resistance R11 is implemented by the diffusion layer R11. The diffusion layer R11 has characteristics such as the area and impurity concentration in accordance with the resistance.

Two or more resistances R11 may be prepared, and a suitable one may be selected with progress of formation of the memory device 1. Specifically, diffusion layer resistances R11 which have various values are formed, a suitable value for the resistance R11 is determined after memory cells MC are formed above the diffusion layers. Then, structures of the M0 interconnect M0, the plugs P1 to P4, and the M1 interconnects M1 are determined to implement the determined resistance value. This can adjust the value of the diffusion layer resistance R11, which is formed before the formation of the memory cells MC after the formation of the memory cell MC.

Figure 8:
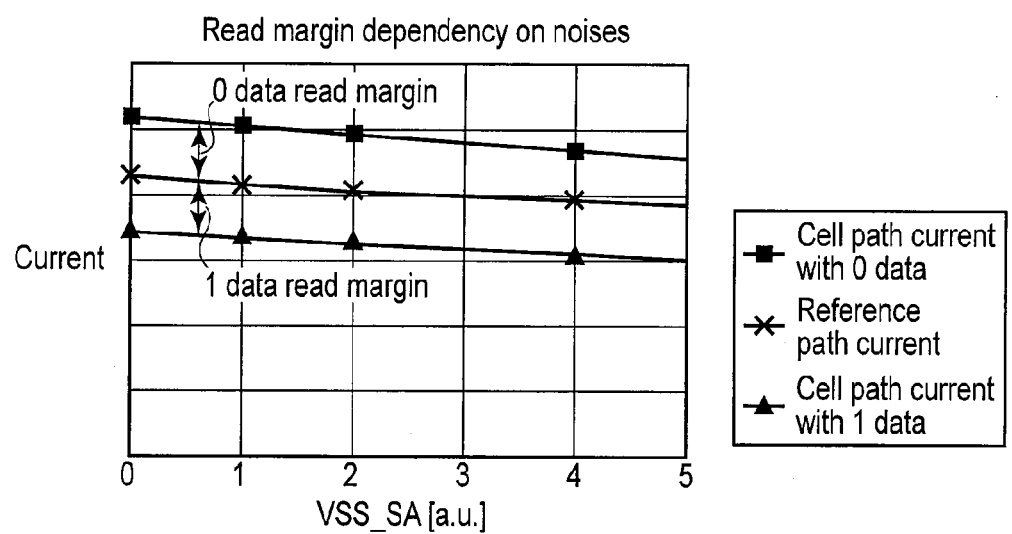
FIG. 8 illustrates a relationship between a potential VSS_SA and some currents according to the first embodiment.

The insertion of the resistance R11 makes the variation of the reference current Iref due to the variation of the potential VSS_SA follow the cell current Icell variation. Specifically, variation of the two currents Iref and Icell due to the variation of the potential VSS_SA will be similar to each other. This is illustrated in FIG. 8. FIG. 8 illustrates relationship between the potential VSS_SA and some currents in accordance with the first embodiment. Specifically, FIG. 8 shows a current through a data cell path DP including a cell holding 0 data, a current through a data cell path DP including a cell holding 1 data, and a current through the reference path RP as FIG. 2. Note that FIG. 8 illustrates an example where the value of the resistance R11 is the average of the resistances of a data cell path including a 0-data-holding-cell MC, and that of a data-cell path including 1-data-holding-cell MC.

As shown in FIG. 8, the reference current Iref exhibits the same variation as each cell current Icell with 0 data and 1 data to the increase in noise to the potential VSS_SA. As a result, the read margin for 0 data holding, i.e., the difference between the cell current Icell for a 0-data-cell read and the reference current Iref, is almost constant regardless of the increase in noise to the potential VSS_SA. Similarly, the difference between the cell current Icell for a 0-data-cell read and the reference current Iref is almost constant. In other words, the data read margin is almost constant over variation of the potential VSS_SA regardless of 0 and 1 data held.

As described above, according to the first embodiment, the memory device 1 has the resistance R11 of a value which makes the resistance of the reference path RP close to the resistance of the data-cell path DP during reads between the reference node RP and node VSS_SA. The insertion of the resistance R11 makes the cell current Icell variation follow that of the reference current Iref because of the variation of the potential VSS_SA. Therefore, the variations of the two currents Iref and Icell due to the variation of the potential VSS_SA are similar to each other. As a result, data read margin can be maintained over the variation of the potential VSS_SA.

Second Embodiment

The second embodiment is configured with the first embodiment. FIG. 9 is a circuit diagram of a part of the memory device 1 according to the second embodiment. The configuration of the overall memory device 1 of the second embodiment is the same as that of the first embodiment (FIG. 3). The memory device 1 of the second embodiment, however, differs from that of the first embodiment in the reference signal generator 14. As shown in FIG. 9, the memory device 1 includes components and connection of the memory device 1 of the first embodiment; however the transistor QN24 receives at the gate the potential Vg0 as the gate of the transistor QN2 instead of the output of the constant current generator 31 in FIG. 6. In other words, the gate of the transistor QN24 is coupled to the gate of the transistor QN2.

The gates of the transistor QN2 and QN24 are coupled to each other. This makes the noise on the gates same. This is contrastive to a case with individual gates, where different noise is applied to the gates. The interconnection of the two gates results in bias states of the transistors QN2 and QN24 similar than would be with two gates independent. For this reason, behaviors of the reference path RP and data cell path DP are also similar to each other, and the reference current Iref and cell current Icell vary because of the noise with a decreased difference. This makes the memory device 1 robust to the noise. Furthermore, the constant current generator 31 is shared by the transistor QN2 and QN24. This avoids the necessity of the constant current generator 31 which can in turn reduce the power consumption and area of the memory device 1.

As described above, according to the second embodiment, the memory device 1 has the resistance R11 of a value which makes the resistance of the reference path RP close to the resistance of the data-cell path DP during reads between the reference node RP and node VSS_SA as in the first embodiment. This produces the same advantage as those of the first embodiment. Furthermore, according to the second embodiment, the gates of the transistor QN2 and QN24 are coupled to each other. This can implement a sense amplifier more robust to noise and requiring reduced power consumption and area.

The configuration of the overall memory device 1, memory cell array, memory cells, and the sense amplifier 11 are not limited to the above examples. For example, it is possible to use those disclosed in the U.S. Pat. No. 7,649,792 specification and the United States Patent application publication No. 2012/0286339, entire contents of which are incorporated herein by reference.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
 a memory cell comprising a variable resistance;
 a sense amplifier comprising a first input and a second input, the sense amplifier outputting a signal in accordance with a difference between the first and second inputs, and being selectively coupled at the second input to the memory cell;
 a resistor in a first path between the first input of the sense amplifier and a ground node; and
 a second path comprising the memory cell between the second input of the sense amplifier and the ground node,
 wherein the resistor has a value between a first resistance of the second path including the memory cell holding first data and a second resistance of the second path including the memory cell holding second data, and
 wherein the resistor comprises one of a gate resistance, a diffusion layer resistor, a metal resistor, a transistor resistor, and a combination thereof.

2. The device of claim 1, wherein the resistor has a value greater than or equal to 10 kΩ.

3. The device of claim 1, wherein:
 the first path includes a first transistor coupled at a first end to the first input of the sense amplifier,
 the memory device further comprises a second transistor between the second input of the sense amplifier and the memory cell, and
 a gate of the first transistor is coupled to a gate of the second transistor.

4. The device of claim 3, wherein:
 the first transistor clamps a potential of a second end of the first transistor, and
 the second transistor clamps a potential of the second transistor at a memory cell side.

5. The device of claim 1, wherein:
 the first path includes a first transistor coupled at a first end to the first input of the sense amplifier, and the resistor is coupled between a second end of the first transistor and the ground node.

6. The device of claim 5, wherein:
 the second path includes a second transistor coupled at a first end to the second input of the sense amplifier,
 the first resistance is a resistance between a second end of the second transistor and the ground node including the memory cell holding the first data, and
 the second resistance is a resistance between the second end of the second transistor and the ground node including the memory cell holding the second data.

7. The device of claim 1, wherein:
 the first path includes a first transistor, and
 a first end of the first transistor is coupled to the first input of the sense amplifier, and a second end of the first transistor is directly coupled to the resistor.

8. A memory device comprising:
 a memory cell with a variable resistance;
 a sense amplifier comprising a first input and a second input, the sense amplifier outputting a signal in accordance with a difference between the first and second inputs, and being selectively coupled at a second input to the memory cell;
 a first transistor coupled at a first end to the first input of the sense amplifier and clamping a potential of a second end thereof;
 a resistor between the second end of the first transistor and a ground node; and
 a second transistor coupled at a first end thereof to the second input of the sense amplifier and clamping a potential of a second end thereof,
 wherein the resistor has a value between a resistance of a path between the second end of the second transistor and the ground node including the memory cell holding first data and a resistance of a path between the second end of the second transistor and the ground node including the memory cell holding second data, and
 wherein the resistor comprises one of a gate resistance, a diffusion layer resistor, a metal resistor, a transistor resistor, and a combination thereof.

9. The device of claim 8, wherein the resistor has a value greater than or equal to 10 kΩ.

10. The device of claim 8, wherein:
 a gate of the first transistor is coupled to a gate of the second transistor.

11. The device of claim 8, wherein:
 the resistor is directly coupled to the second end of the first transistor.

* * * * *